(12) United States Patent
Tokita (10) Patent No.: US 7,528,930 B2
(45) Date of Patent: May 5, 2009

(54) EXPOSURE APPARATUS AND DEVICE MANUFACTURING METHOD

(75) Inventor: Toshinobu Tokita, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/029,674

(22) Filed: Jan. 4, 2005

(65) Prior Publication Data

US 2005/0146694 A1  Jul. 7, 2005

(30) Foreign Application Priority Data

Jan. 7, 2004  (JP)  ............................. 2004-002058

(51) Int. Cl.
*G03B 27/52* (2006.01)
*G03B 27/42* (2006.01)

(52) U.S. Cl. .......................................... 355/30; 355/53

(58) Field of Classification Search ................... 355/30, 355/53, 67, 72, 75, 55; 250/548
See application file for complete search history.

(56) References Cited

U.S. PATENT DOCUMENTS

| | | | | |
|---|---|---|---|---|
| 4,509,852 A | * | 4/1985 | Tabarelli et al. | 355/30 |
| 4,825,247 A | * | 4/1989 | Kemi et al. | 355/55 |
| 5,610,683 A | * | 3/1997 | Takahashi | 355/53 |
| RE38,320 E | * | 11/2003 | Nishi et al. | 355/67 |
| 6,731,371 B1 | * | 5/2004 | Shiraishi | 355/30 |
| 6,809,794 B1 | * | 10/2004 | Sewell | 355/30 |
| 6,867,844 B2 | * | 3/2005 | Vogel et al. | 355/30 |
| 6,954,255 B2 | * | 10/2005 | Hasegawa et al. | 355/30 |
| 7,061,573 B2 | * | 6/2006 | Tsukamoto | 355/30 |
| 2003/0174408 A1 | | 9/2003 | Rostalski et al. | 359/642 |
| 2004/0075895 A1 | * | 4/2004 | Lin | 359/380 |
| 2005/0046813 A1 | * | 3/2005 | Streefkerk et al. | 355/30 |
| 2006/0028632 A1 | * | 2/2006 | Hazelton et al. | 355/53 |
| 2006/0034344 A1 | * | 2/2006 | Hirano et al. | 374/137 |
| 2007/0070316 A1 | * | 3/2007 | Ehrmann et al. | 355/53 |

FOREIGN PATENT DOCUMENTS

| | | |
|---|---|---|
| JP | 10-303114 A | 11/1998 |
| JP | H10-303114 | 11/1998 |
| KR | 1999-0034784 | 5/1999 |
| WO | 99/49504 | 9/1999 |

OTHER PUBLICATIONS

Office Action from Korean Patent Office, dated Jul. 28, 2006, concerning Korean Patent Application No. 10-2005-0001019.

* cited by examiner

*Primary Examiner*—Peter B Kim
(74) *Attorney, Agent, or Firm*—Locke Lord Bissell & Liddell, LLP (57) ABSTRACT

An exposure apparatus includes a projection optical system for projecting a pattern on a reticle onto a substrate, the projection optical system including an optical element closest to the substrate, an illumination optical system for illuminating the reticle using light from a light source, and a temperature controller for controlling a temperature of the optical element and thereby a temperature of a fluid that is filled in a space between the optical element in the projection optical system and the substrate, the exposure apparatus exposing the substrate via said projection optical system and the fluid.

9 Claims, 7 Drawing Sheets

PRIOR ART

EXPOSURE APPARATUS AND DEVICE MANUFACTURING METHOD

BACKGROUND OF THE INVENTION

The present invention relates generally to an exposure apparatus that exposes a pattern of an original, such as a reticle, onto a substrate, such as a wafer, and a device manufacturing method that uses the exposure apparatus to manufacture various devices, such as a semiconductor chip and a liquid crystal panel, and more particularly to an immersion type exposure apparatus that fills the fluid in the space between the projection optical system and substrate and exposes the substrate via the fluid, and a device manufacturing method using such an exposure apparatus.

An immersion type exposure apparatus fills the fluid in the space between the substrate and an optical element in the projection optical system, which is closest to the substrate, and increases a numerical aperture ("NA") using the high refractive index of the fluid. Therefore, the immersion type exposure apparatus is expected to provide the high resolution.

Proposed for the immersion type exposure apparatus are a method for immersing the entire substrate in the fluid (see, for example, Japanese Patent Application, Publication No. 10-303114), a method that fills the fluid only in the space between the substrate and the optical element in the projection optical system, which is closest to the substrate (see, for example, International Publication No. 99/49504 pamphlet), etc.

Figure 5:
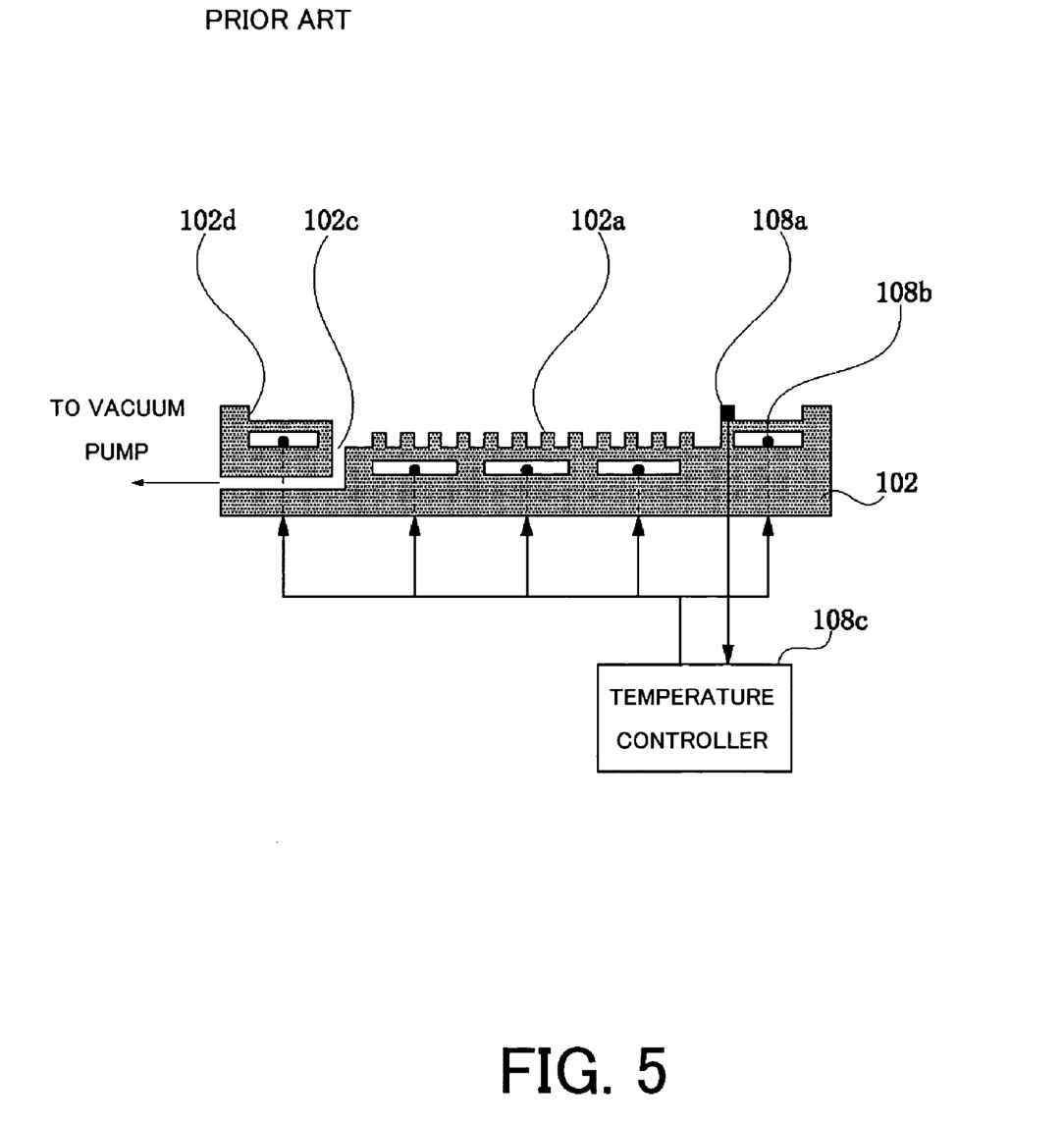
FIG. 5 is a view for explaining temperature control in a conventional immersion type exposure apparatus.

FIG. 5 shows a structure of Japanese Patent Application, Publication No. 10-303114. FIG. 5 is a sectional view of a substrate chuck 102 that holds a substrate. The substrate is vacuum-absorbed so that its rear surface contacts an absorptive surface 102a. A vacuum pump provides the vacuum exhaustion for the absorption via a vacuum groove 102c. The fluid as an immersion material flows on the substrate held by the absorptive surface 102a. The fluid is introduced so that the fluid does not spill from the wall 102d.

Japanese Patent Application, Publication No. 10-303114 comments upon the influence of the fluid's temperature changes to the fluid's refractive index changes, and includes a temperature sensor 108a, a temperature adjuster 108b, and temperature controller 108c. The temperature controller 108c and the temperature adjuster 108b that includes a Peltier element control the fluid's temperature so that the fluid's temperature detected by the temperature sensor 108a becomes constant.

However, the above prior art has the following disadvantages:

In FIG. 5, the temperature sensors 108a arranged at plural points can detect the fluid's temperature outside the exposure area. However, the temperature sensor 108a cannot be arranged on the substrate, and thus it is impossible to detect the fluid's temperature at the exposure area. In other words, the feedback control based on the detection result by the temperature sensor 108a using the temperature controller 108c and the temperature adjuster 108b does not provide highly precise temperature control.

The imprecise temperature control at the exposure area deteriorates the resolution performance since the fluid's refractive index fluctuates with the fluid's temperature changes at the exposure area.

This is not a unique problem for the immersion type exposure apparatus shown in FIG. 5 that immerses the entire substrate in the fluid. Use of the temperature control shown in FIG. 5 for the immersion type projection exposure apparatus that fills, in the fluid, only the space between the substrate and the optical element that is closest to the substrate would lessen the contact opportunities between the temperature sensor 108a and the fluid, or could not easily detect the fluid's temperature, resulting in the imprecise temperature control. Then, along with the fluid's temperature changes at the exposure area, the fluid's refractive index varies and the resolution performance deteriorates.

BRIEF SUMMARY OF THE INVENTION

Accordingly, it is an exemplary object of the present invention to provide an exposure apparatus that precisely and stably controls the temperature of the fluid that is filled in the space between the substrate and the optical element in the projection optical system, which is closest to the substrate.

An exposure apparatus according to one aspect of the present invention includes a projection optical system for projecting a pattern on a reticle onto a substrate, the projection optical system including an optical element closest to the substrate, an illumination optical system for illuminating the reticle using light from a light source, and a temperature controller for controlling a temperature of the optical element and thereby a temperature of a fluid that is filled in a space between the optical element in the projection optical system and the substrate, the exposure apparatus exposing the substrate via said projection optical system and the fluid.

An exposure apparatus according to another aspect of the present invention includes a projection optical system for projecting a pattern of a reticle onto a substrate, an illumination optical system for illuminating the reticle using light from a light source, a holder for holding the substrate, the holder having a channel, and a temperature controller for supplying a fluid whose temperature has been controlled, to the channel in the holder the fluid being filled in a space between the projection optical system and the substrate, the exposure apparatus exposing the substrate via the projection optical system and the fluid.

A device manufacturing method according to still another aspect of the present invention includes the steps of exposing a substrate using the above exposure apparatus, and developing the substrate that has been exposed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Embodiments of the present invention will now be described in detail in accordance with the accompanying drawings.

First Embodiment

Figure 1:
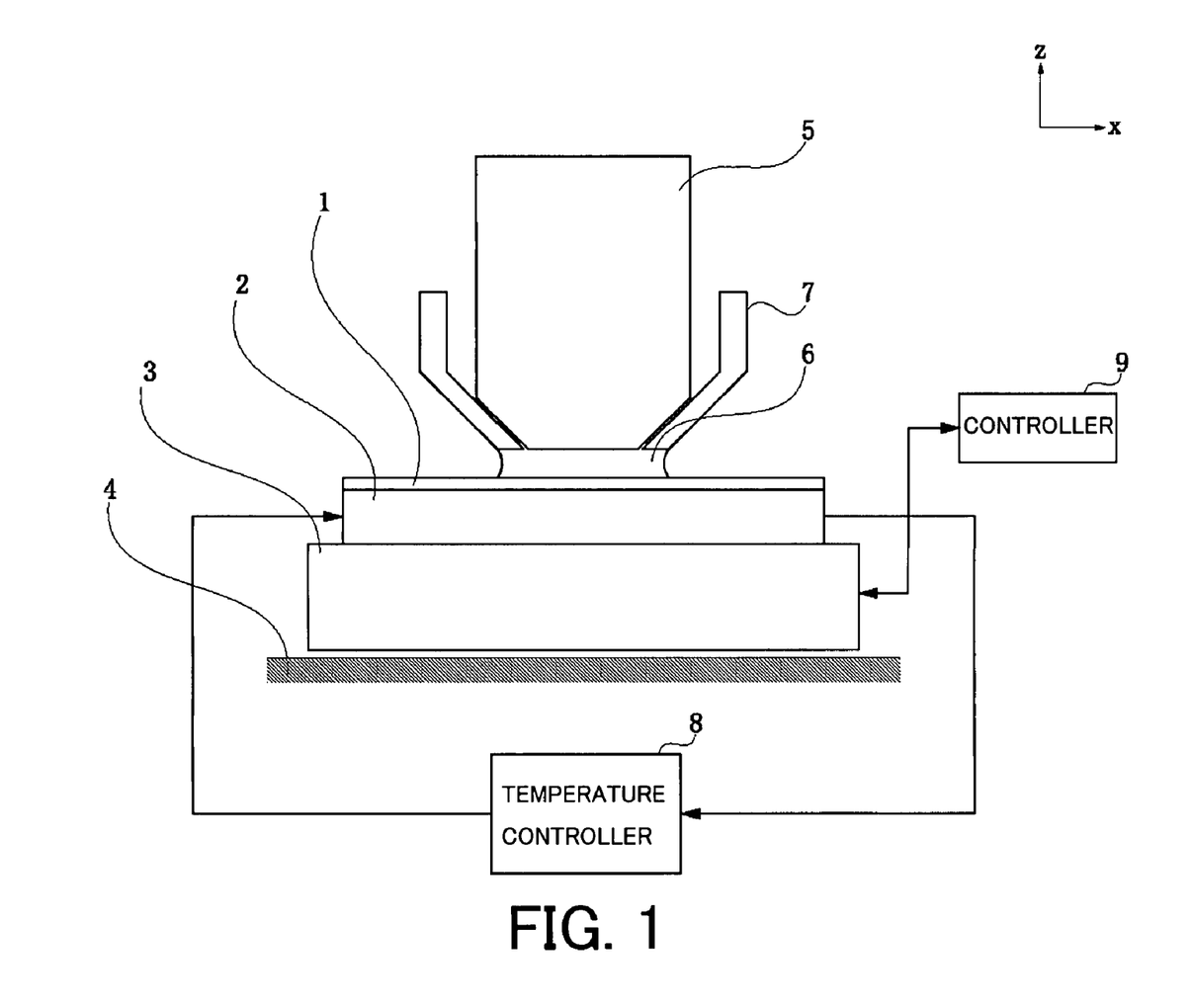
FIG. 1 shows a typical structure of an exposure apparatus according to the present invention.

FIG. 1 is a view for explaining a structure of an exposure apparatus according to the present invention.

In FIG. 1, 1 denotes a substrate, such as a wafer. 2 denotes a substrate chuck as a holder that holds the substrate 1. A holding method of the substrate includes a vacuum or electrostatic absorption. 3 denotes a substrate stage, and preferably has a six-axis driving shafts in and around XYZ directions. 4 denotes a stage stool, and the substrate stage 3 is driven on the stage stool 4 via the air bearing or magnetic levitation. 5 denotes a projection optical system for projecting a pattern of a reticle (mask) (not shown) onto the substrate. The reticle is located above the projection optical system 5, placed on the reticle stage, and scanned in synchronization with the substrate stage 3, although FIG. 1 omits the reticle. An illumination optical system and a light source for the exposure light are also located above the reticle, but FIG. 1 omits these components similarly. The light source may use an ArF excimer laser, a $F_2$ laser, etc. 6 denotes the fluid to be filled in the space between the substrate 1 and the optical element that is closest to the substrate 1 in the projection optical system 5 in the immersion-type projection exposure apparatus. When the light source is the ArF excimer laser, the fluid 6 uses the water. When the light source is the $F_2$ laser, the fluid 6 uses fluoride. 7 denotes a fluid supply nozzle that supplies and recovers the fluid 6 between the substrate 1 and the optical element in the projection optical system 5, which is closest to the substrate 1. 8 denotes a temperature controller that flows temperature-controlled water in the substrate chuck 2 that forms a water conduit as a temperature controlling channel. 9 denotes a controller that provides measurement control over driving of the entire apparatus, such as positional control of the substrate stage 3.

Figure 2:
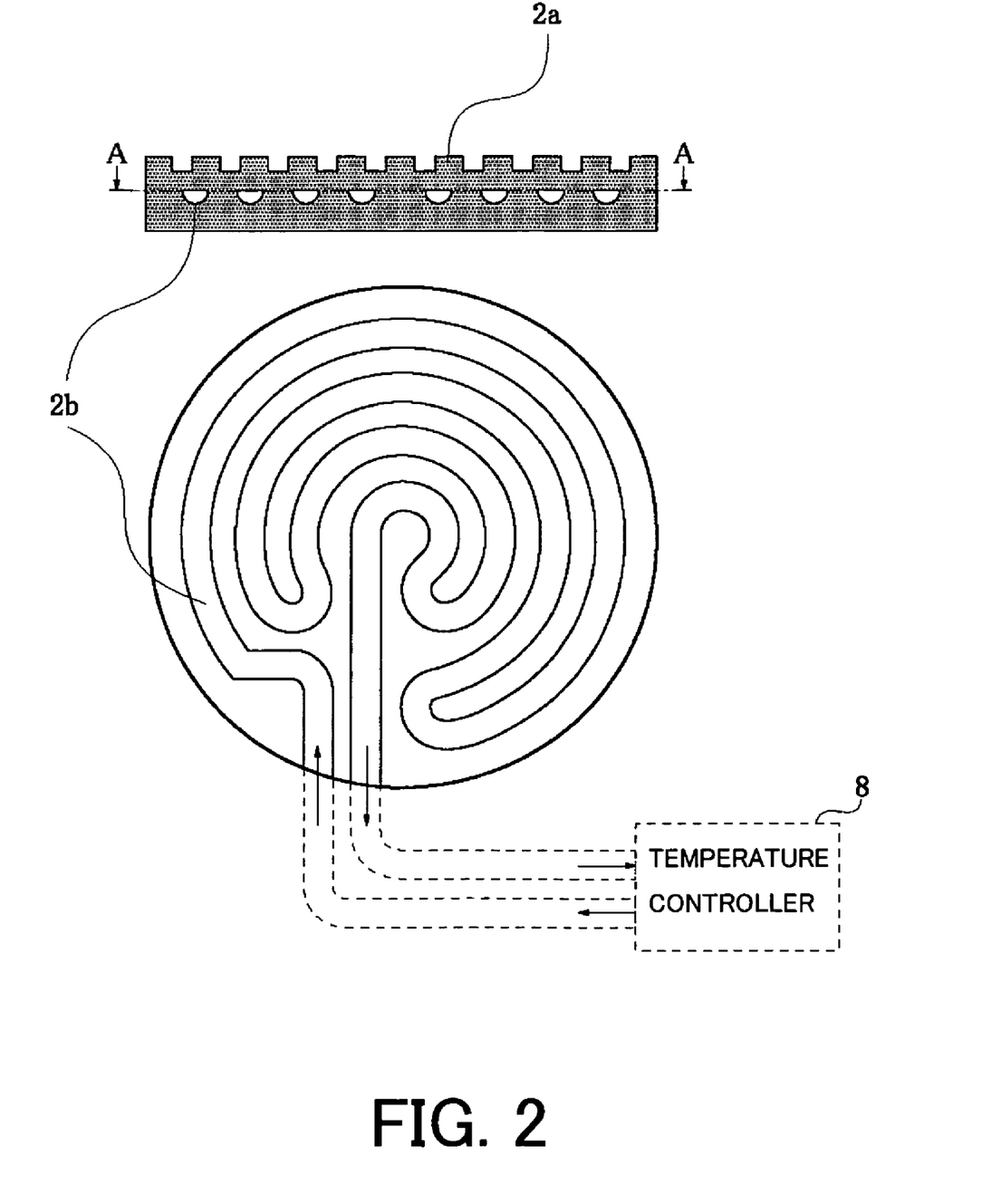
FIG. 2 is a view for explaining a temperature controller and a substrate chuck according to a first embodiment of the present invention.

FIG. 2 is a view for explaining the substrate chuck 2 of the first embodiment. An upper view of FIG. 2 shows a section of the substrate chuck 2, and a lower view shows a section taken along a line A-A.

In FIG. 2, 2a denotes a pin (protrusion). The pins 2a contact and hold the rear surface of the substrate 1. In order to protect the flatness of the substrate 1, for example, from a foreign particle to be included between the rear surface of the substrate 1 and the substrate chuck 2, the surface of the substrate chuck 2 has structurally the pins 2a and reduces the contact area. 2b denotes a water conduit for temperature control. A flow of the temperature-controlled water in the water conduit in the substrate chuck 2 controls the temperature of the substrate chuck 2. Preferably, the temperature controller 8 controls the temperature of the water within a predetermine temperature range. Also preferably, the water conduit 2b is distributed over the entire surface of the substrate chuck 2. The holding method of the substrate may use the vacuum or electrostatic absorption, but illustrations of the piping and wiring for the holding method are omitted.

The substrate chuck 2 is usually made of ceramics, such as SiC, and it may be thus difficult to form a water conduit in the substrate chuck 2. One solution for this problem is to form one substrate chuck 2 by pasting two sheet elements to each other. For example, two sheets, i.e., an upper part above the A-A section or the side for holding the substrate 1, and a lower part above the A-A section or the side of the substrate stage 3 are produced and pasted by adhesives or anode junctions. At that time, a water conduit is formed in at least one of the substrate 1 holding side and the substrate stage 3 side. The channel is not limited to a shape shown FIG. 2, but may be arbitrary. For example, the channel may be provided around the substrate chuck, not in the substrate chuck. The instant embodiment uses, but is not limited to, the water for the fluid for temperature control. For example, the fluid may be other than the temperature-controlled water, such as gas. The temperature controller 8 may lower the temperature of the temperature-controlled water based on the exposure light irradiation information from the controller 9 (not shown) so as to cancel the temperatures of the substrate 1 and the fluid (not shown), which rise during the exposure.

The aforementioned instant embodiment flows the temperature-controlled water through the channel in the substrate chuck 2, and controls the temperature of the substrate chuck 2 stably. The heat capacity of the substrate chuck 2 is much larger the heat capacity of the substrate 1 and the heat capacity of the fluid 6. Therefore, the temperature control over the substrate chuck 2 would result in temperature control over the substrate 1 and the fluid 6.

Second Embodiment

The first embodiment flows the water whose temperature has been controlled by the temperature controller 8 over almost the entire surface in the substrate chuck 2, and controls the temperatures of the substrate chuck 2 and the fluid 6.

On the other hand, this embodiment quadrisects the water conduit in the substrate chuck 2, and provides more precise temperature control. Similar to the first embodiment, one substrate chuck 2 is formed by pasting two sheets to each other. A structure of the exposure apparatus other than the temperature controller 8 is almost similar to that of the first embodiment, and a description thereof will be omitted.

Figure 3:
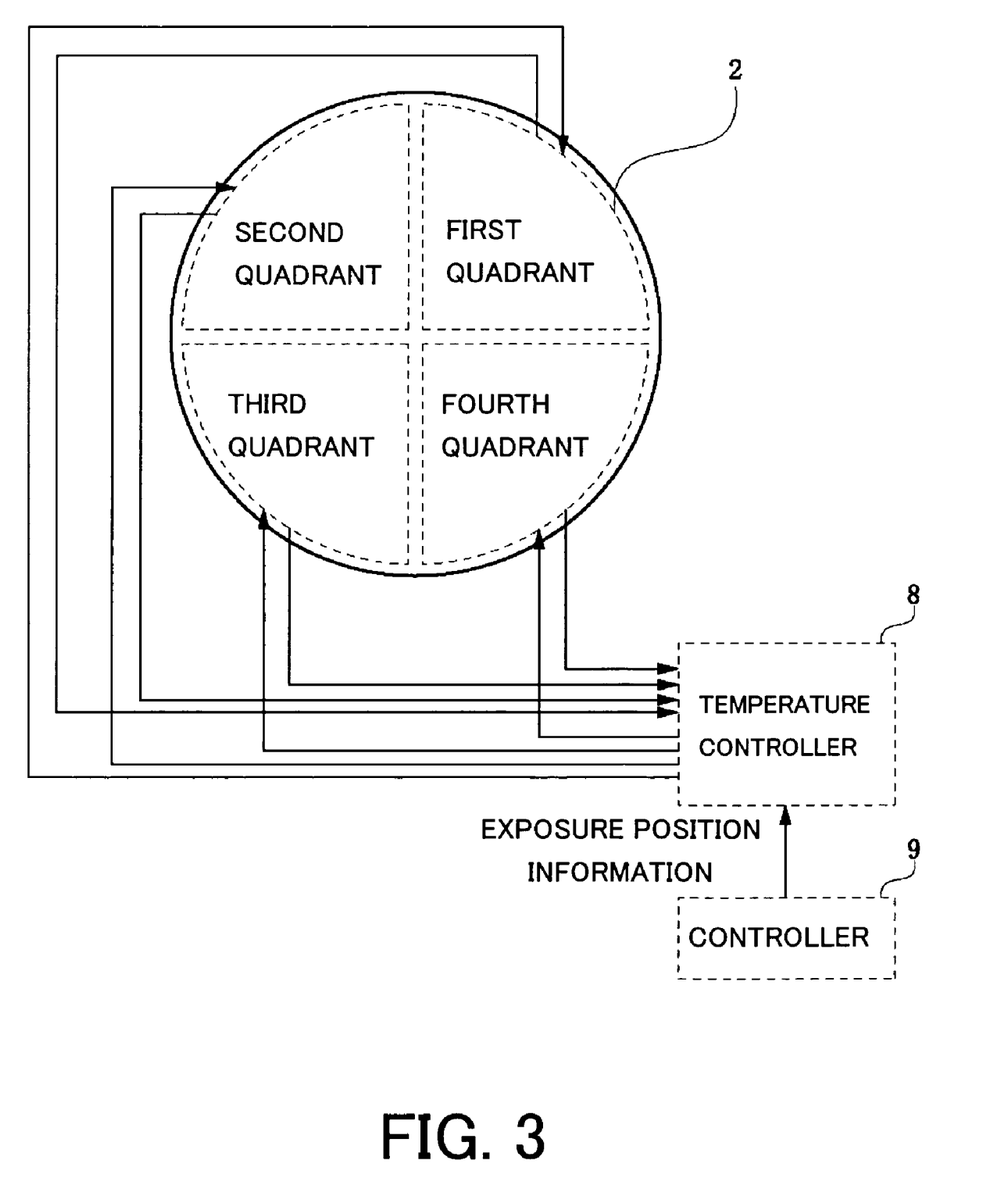
FIG. 3 is a view for explaining a temperature controller and a substrate chuck according to a second embodiment of the present invention.

FIG. 3 is a view for explaining the substrate chuck 2 in the second embodiment, although FIG. 3 omits the detailed water conduit in the substrate chuck 2. As shown by broken lines, the inside of the substrate chuck 2 is divided into first to fourth quadrants, and the water temperature-controlled by the temperature controller 8 is flowed in each quadrant for temperature control. The temperature control uses the temperature-controlled fluid similar to the first embodiment.

A description will now be given of a control method.

The fluid's temperature at each quadrant is controlled constant at an initial state. When the controller 9 sends to the temperature controller 8 the exposure position information indicating that an exposure position is positioned, for example, in the first quadrant, the temperature controller 8 independently changes the temperature of the temperature-controlled water to be flowed in the first quadrant. The exposure position information is defined as information indicative of a position on a wafer, which area is being exposed. The exposure position information can be obtained from a position signal from an interferometer for detecting a position of the wafer stage. This lowers the temperature of the temperature-controlled water so as to cancel the temperatures of the substrate 1 and the fluid 6, which rise due to the exposure energy. This control may be feedforward. That is, the temperature of a position to be exposed may be controlled, rather than the temperature control of the current exposed position.

While FIG. 3 uses the quadrisections, i.e., the first to fourth quadrants, the present invention is not limited to this embodiment and the number of divisions may be arbitrary.

The temperature controller 8 may lower the temperature of the temperature-controlled fluid based on the exposure light irradiation information, from the controller 9 (not shown), such as information of the integral exposure dose to the substrate 1 and the fluid 6, so as to cancel the temperatures of the substrate 1 and the fluid 6, which rise during the exposure.

This embodiment can control the temperature of the substrate chuck 2 for each divided part, and thereby controls the temperatures of not only the substrate chuck 2 but also the substrate 1 and the fluid 6.

Third Embodiment

The first and second embodiment controls the temperature of the fluid 6 by controlling the temperature of the substrate chuck 2.

Figure 4:
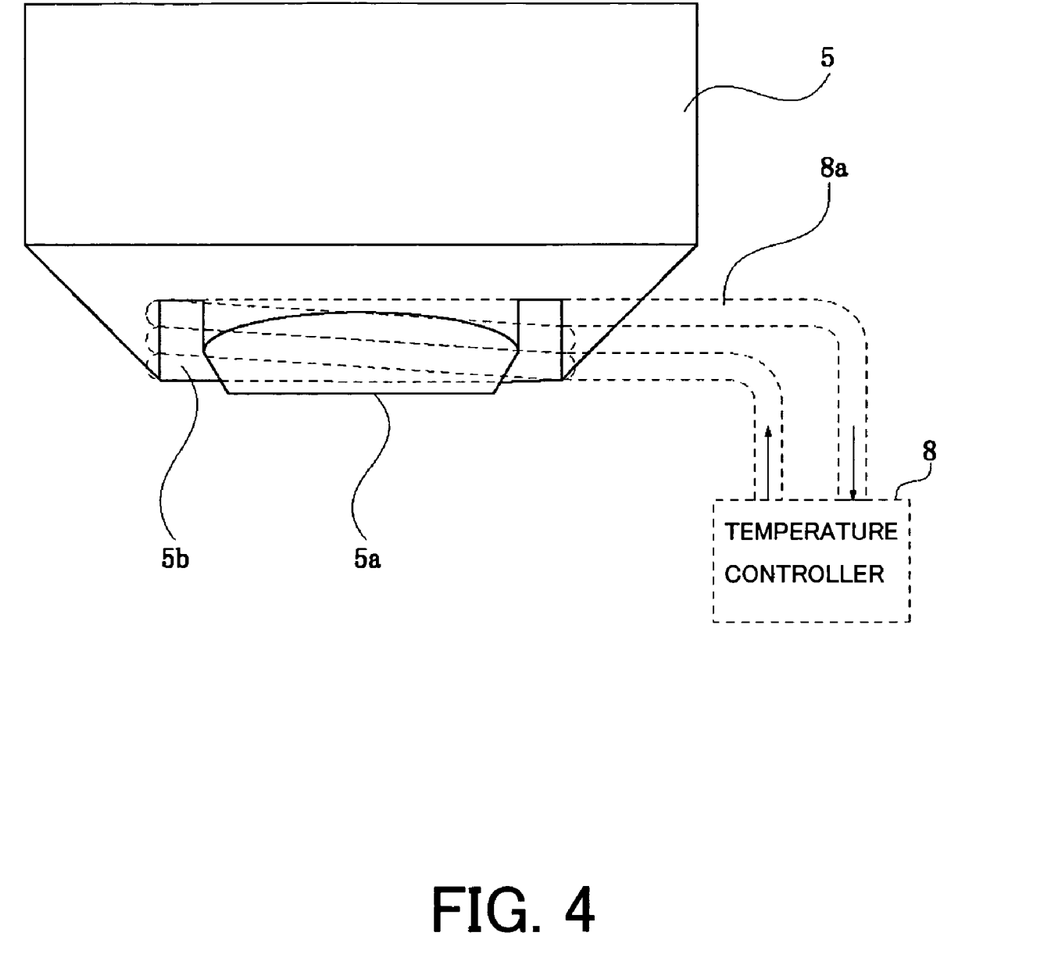
FIG. 4 is a view for explaining a temperature controller and a substrate chuck according to a third embodiment of the present invention.

On the other hand, this embodiment controls the temperature of the optical element 5a in the projection optical system 5, which is closest to the substrate 1, and thereby controls the temperature of the fluid 6 between the optical element 5a and the substrate 1. A structure of the exposure apparatus other than the temperature controller 8 is similar to that of FIG. 1, and a description thereof will be omitted.

FIG. 4 is a view for explaining a temperature control structure of a third embodiment. In FIG. 4, 5a denotes a final lens, which is an optical element in the projection optical system 5 closest to the substrate 1. 5b denotes a support part for supporting the final lens 5a. The support member 5b is held in the projection optical system 5. A description will now be given of the temperature-controlled part that is indicated by a broken line. 8a denotes a temperature controlling tube, and encloses the support part 5b. The water whose temperature has been controlled by the temperature controller 8 to a predetermined temperature range passes the temperature controlling tube 8a and controls the temperatures of the support part 5b and final lens 5a.

The temperature controller 8 may lower the temperature of the temperature-controlled fluid based on the exposure light irradiation information from the controller 9 (not shown), such as information of the integral exposure dose to the substrate 1 and the fluid 6, so as to cancel the temperatures of the substrate 1 and the fluid 6, which rise during the exposure.

The fluid uses the same temperature-controlled water as that in the first and second embodiment for temperature control.

While FIG. 4 describes a method for enclosing the support part 5b with the temperature control tube 8a, the present invention is not limited to this embodiment. For example, the present invention may use a method for providing a water conduit as a temperature controlling channel in the support part 5b, and flowing the temperature-controlled water in the channel, or a method for blowing the temperature-controlled gas, such as helium and nitrogen, against the final lens 5a. Even in this case, the temperature controller 8 may lower the temperature of the gas so as to cancel the temperatures of the final lens 5a and the fluid 6 (not shown), which rise during the exposure, based on the exposure light irradiation information from the controller 9 (not shown).

For control over the temperature of the fluid 6, the first and second embodiments control the temperature of the substrate chuck 2 whereas the third embodiment controls the temperatures of the final lens 5a and support part 5b. However, the present invention may control the temperature of the fluid 6 using at least one of the methods and, of course, may use both methods for more stable and more precise temperature control of the fluid 6. In this case, these methods may share a common channel of the temperature controlling fluid.

The instant embodiment flows the water having the controlled temperature, around the support part 5b and the final lens 5a, and controls the temperature of the final lens 5a. Since the heat capacity of the final lens 5a is much greater than the heat capacity of the fluid 6, control over the temperature of the final lens 5a would result in control over the temperature of the fluid 6. Since the temperature is controlled near the area onto which the exposure light is irradiated, the fluid 6's temperature can be controlled with high precision.

Thus, the aforementioned embodiments of the inventive exposure apparatus can control the fluid's temperature that rises due to the absorption of the exposure energy, and thus maintain the fluid's refractive index changes within a predetermined range, providing an exposure apparatus having high-resolution performance.

Fourth Embodiment

A description will now be given of an embodiment of a device manufacturing method using the above exposure apparatus of the above embodiment.

Figure 6:
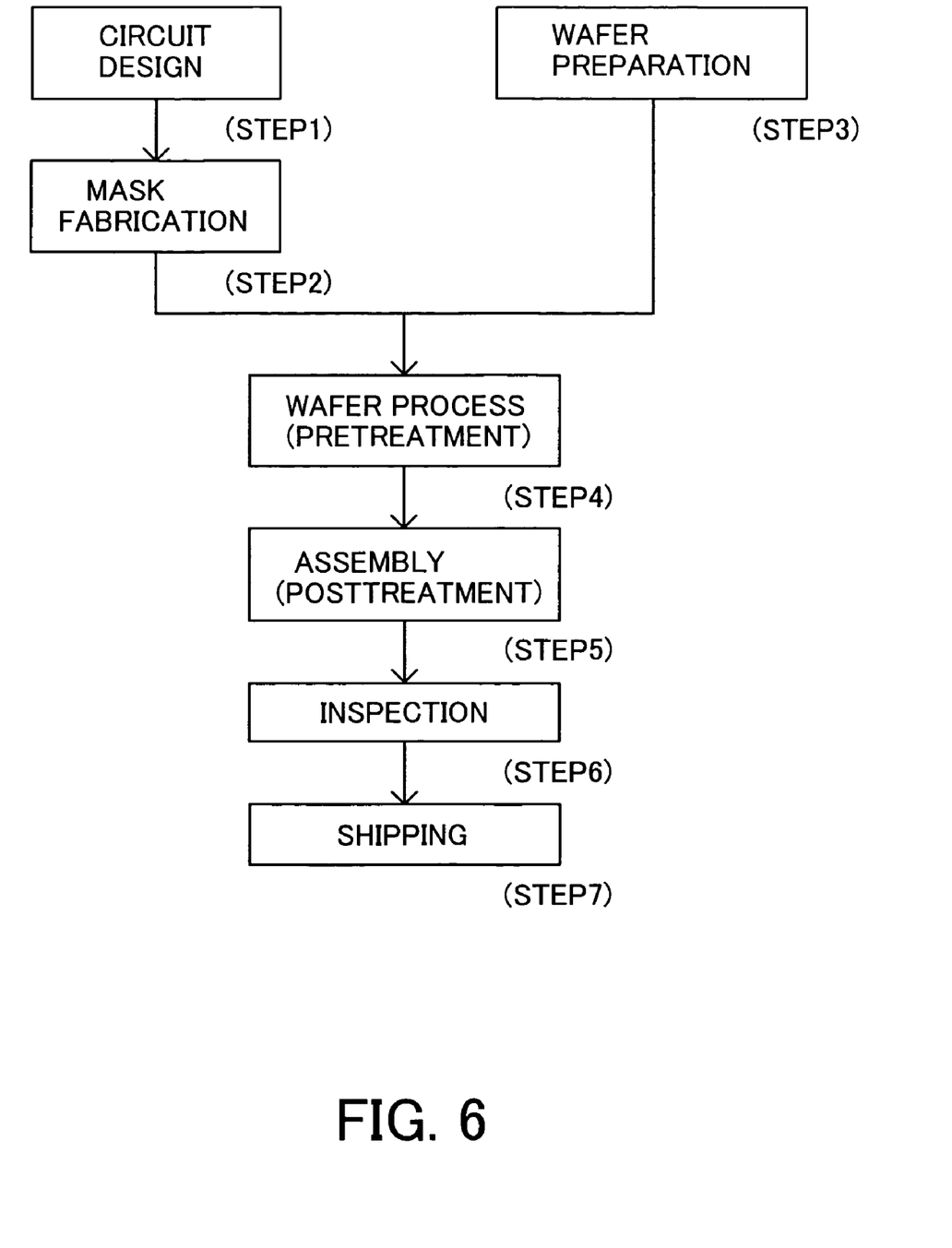
FIG. 6 is a device manufacturing flow.

FIG. 6 is a manufacture flow of fine devices (i.e., semiconductor chips such as IC and LSI, LC panels, CCDs, thin film magnetic heads, micro-machines, etc.). Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 7:
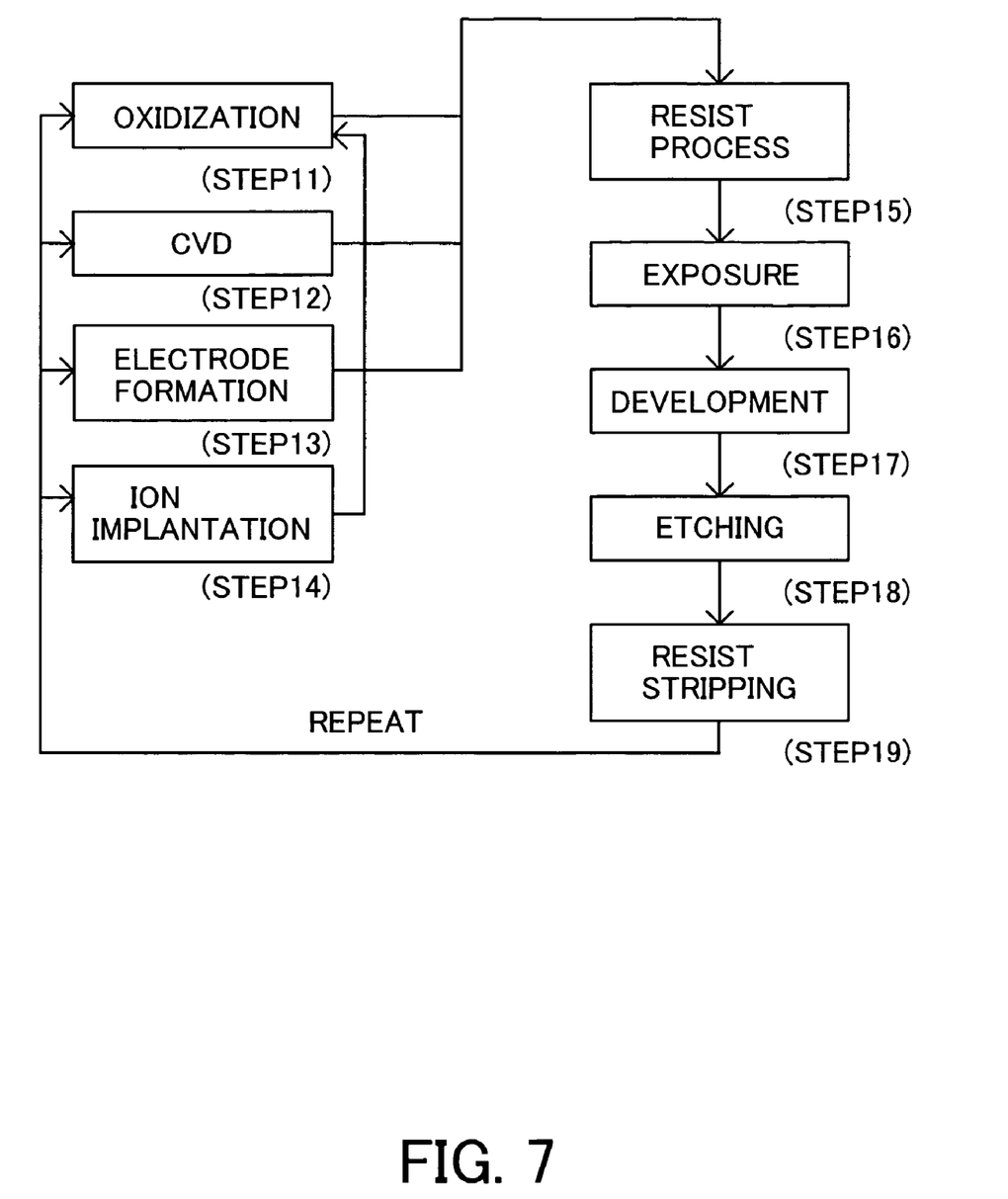
FIG. 7 is a wafer process in FIG. 6.

FIG. 7 is a detailed flow of the wafer process. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the aforementioned exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. Use of the manufacture method of the instant embodiment would manufacture highly integrated semiconductor devices, which have been conventionally hard to be manufactured.

The entire disclosure of Japanese Patent Application No. 2004-002058 filed on Jan. 7, 2004 including claims, specification, drawings, and abstract are incorporated herein by reference in its entirety.

As many apparently widely different embodiments of the present invention can be made without departing from the sprit and scope thereof, it is to be understood that the invention is not limited to the specific embodiments thereof except as defined in the claims.

What is claimed is:

1. An exposure apparatus for exposing a substrate via liquid, said exposure apparatus comprising:
    a projection optical system for projecting a pattern of a reticle onto a substrate, the projection optical system including a final lens contacting the liquid, and a support member for supporting the final lens;
    a temperature controller configured to control temperature of the support member and to thereby control a temperature of the liquid, the liquid being filled in a space between the final lens and the substrate; and
    a stage for moving the substrate relative to the final lens.

2. An exposure apparatus according to claim 1, wherein the temperature controller controls the temperature of the support member by supplying a temperature-controlled fluid to a conduit in the support member.

3. An exposure apparatus according to claim 2, wherein the temperature controller controls the temperature of the fluid based on exposure position information or exposure light irradiation information.

4. A device manufacturing method comprising the steps of:
    exposing a substrate using an exposure apparatus for exposing a substrate via liquid; and
    developing the substrate that has been exposed,
    wherein the exposure apparatus includes:
        a projection optical system for projecting a pattern of a reticle onto a substrate, the projection optical system including a final lens contacting the liquid, and a support member for supporting the final lens;
        a temperature controller configured to control temperature of the support member and to thereby control a temperature of the liquid, the liquid being filled in a space between the final lens and the substrate; and
        a stage for moving the substrate relative to the final lens.

5. An exposure apparatus for exposing a substrate via the liquid comprising:
    a projection optical system for projecting a pattern of a reticle onto a substrate, the projection optical system including a final lens contacting the liquid;
    a support member for supporting the final lens;
    a chuck for holding the substrate; and
    a temperature controller configured to control a temperature of the support member and the chuck and to thereby control a temperature of the liquid, liquid being filled in a space between the final lens and the substrate.

6. An exposure apparatus according to claim 5, wherein the support member has a fluid conduit for temperature control, and
    wherein the temperature controller supplies a temperature-controlled fluid to the conduit in the support member.

7. An exposure apparatus according to claim 5, wherein the temperature controller supplies a temperature-controlled fluid to a channel in the chuck.

8. An exposure apparatus according to claim 5, wherein the temperature controller supplies a temperature-controlled fluid to both the conduit in the support member and a channel in the chuck.

9. A device manufacturing method comprising the steps of:
    exposing a substrate using an exposure apparatus for exposing a substrate via the liquid; and
    developing the substrate that has been exposed,
    wherein the exposure apparatus includes:
        a projection optical system for projecting a pattern of a reticle onto a substrate, the projection optical system including a final lens contacting the liquid;
        a support member for supporting the final lens;
        a chuck for holding the substrate; and
        a temperature controller configured to control a temperature of the support member and the chuck, and to thereby control a temperature of the liquid, the liquid being filled in a space between the final lens and the substrate.

* * * * *